(12) United States Patent
Inukai (10) Patent No.: US 9,151,784 B2
(45) Date of Patent: Oct. 6, 2015

(54) AC VOLTAGE DETECTING CIRCUIT AND IMAGE FORMING APPARATUS HAVING THE SAME

(75) Inventor: Katsumi Inukai, Iwakura (JP)

(73) Assignee: BROTHER KOGYO KABUSHIKI KAISHA, Nagoya-Shi, Aichi-Ken (JP)

( * ) Notice: Subject to any disclaimer, the term of this patent is extended or adjusted under 35 U.S.C. 154(b) by 393 days.

(21) Appl. No.: 13/569,768

(22) Filed: Aug. 8, 2012

(65) Prior Publication Data

US 2013/0038318 A1 Feb. 14, 2013

(30) Foreign Application Priority Data

Aug. 9, 2011 (JP) ................................. 2011-173815

(51) Int. Cl.
*G01R 19/18* (2006.01)
(52) U.S. Cl.
CPC ...................................... *G01R 19/18* (2013.01)
(58) Field of Classification Search
CPC ....................................................... G01R 19/18
See application file for complete search history.

(56) References Cited

U.S. PATENT DOCUMENTS

| | | | | |
|---|---|---|---|---|
| 4,484,131 | A * | 11/1984 | Jenkinson | 324/533 |
| 5,563,332 | A * | 10/1996 | Yasuda | 73/35.08 |
| 7,193,337 | B2 * | 3/2007 | Nguyen | 307/130 |
| 2001/0004073 | A1 * | 6/2001 | Little et al. | 219/501 |
| 2004/0004853 | A1 | 1/2004 | Na | |
| 2004/0190923 | A1 | 9/2004 | Inukai | |
| 2008/0223719 | A1 * | 9/2008 | Tam | 204/403.01 |
| 2010/0166446 | A1 | 7/2010 | Naganawa et al. | |
| 2010/0166466 | A1 * | 7/2010 | Sato | 399/262 |
| 2013/0129373 | A1 * | 5/2013 | Inukai | 399/88 |

FOREIGN PATENT DOCUMENTS

| | | |
|---|---|---|
| JP | S57-120263 U | 7/1982 |
| JP | S63-102325 U | 7/1988 |
| JP | H02-284214 A | 11/1990 |
| JP | 2001-305165 A | 10/2001 |

(Continued)

OTHER PUBLICATIONS

Japan Patent Office, Notification of Reasons for Refusal for Japanese Patent Application No. 2011-173815, mailed Aug. 20, 2013.

(Continued)

*Primary Examiner* — Tung X Nguyen
*Assistant Examiner* — Robert P Alejnikov, Jr.
(74) *Attorney, Agent, or Firm* — Merchant & Gould PC (57) ABSTRACT

An AC voltage detecting circuit comprises: a first capacitor including a first electrode configured to connect to one end of an AC power supply, and a second electrode; a second capacitor including a first electrode configured to connect to the other end of the AC power supply, and a second electrode; a current-to-voltage converting circuit, which is connected in series between the second electrode of the first capacitor and the second electrode of the second capacitor, and which is connected to a reference potential, wherein the current-to-voltage converting circuit causes the AC current to pass through the current-to-voltage converting circuit when the AC current returns to the AC power supply, and converts an AC current output from the AC power supply into an detection AC voltage; and a voltage detecting unit, which detects an AC input voltage of the AC power supply, based on the detection AC voltage.

4 Claims, 9 Drawing Sheets

(56) References Cited

FOREIGN PATENT DOCUMENTS

| JP | 2004-038174 A | 2/2004 |
|---|---|---|
| JP | 2004-151998 A | 5/2004 |
| JP | 2004-303469 A | 10/2004 |
| JP | 2010-156754 A | 7/2010 |
| JP | 2010-239774 A | 10/2010 |
| JP | 2011-058921 A | 3/2011 |

OTHER PUBLICATIONS

Decision of Rejection issued in related Japanese application No. 2011-173815, mailed Nov. 5, 2013 (2 pages).

* cited by examiner

AC VOLTAGE DETECTING CIRCUIT AND IMAGE FORMING APPARATUS HAVING THE SAME

CROSS-REFERENCE TO RELATED APPLICATION

This application claims priority from Japanese Patent Application No. 2011-173815 filed on Aug. 9, 2011, the entire subject matter of which is incorporated herein by reference.

TECHNICAL FIELD

This disclosure relates to an AC voltage detecting circuit and an image forming apparatus having the AC voltage detecting circuit, and more specifically, to a technology that detects an AC input voltage.

BACKGROUND

As a technology for detecting an AC input voltage, there has been known a technology a technology for detecting an AC input voltage using a photocoupler, for example.

However, in a method of detecting an AC input voltage using a photocoupler, it is possible to appropriately detect an AC input voltage, but the power consumption of a light emitting diode of the photocoupler is not negligible. Accordingly, a technology for detecting an AC input voltage that can save electric power has been eagerly desired.

SUMMARY

This disclosure provides at least a technology that detects an AC input voltage to save electric power.

In view of the above, an AC voltage detecting circuit of this disclosure comprises a first capacitor, a second capacitor, a current-to-voltage, and a voltage detecting unit. The first capacitor includes a first electrode configured to connect to one end of an AC power supply, and a second electrode. The second capacitor includes a first electrode configured to connect to the other end of the AC power supply, and a second electrode. The current-to-voltage converting circuit is connected in series between the second electrode of the first capacitor and the second electrode of the second capacitor, and which is connected to a reference potential, and the current-to-voltage converting circuit causes the AC current to pass through the current-to-voltage converting circuit when the AC current returns to the AC power supply, and converts an AC current output from the AC power supply into an detection AC voltage. The voltage detecting unit detects an AC input voltage of the AC power supply, based on the detection AC voltage.

Further, an image forming apparatus of this disclosure may comprise the above-described AC voltage detecting circuit.

BRIEF DESCRIPTION OF THE DRAWINGS

The foregoing and additional features and characteristics of this disclosure will become more apparent from the following detailed descriptions considered with the reference to the accompanying drawings, wherein.

DETAILED DESCRIPTION

First Illustrative Embodiment

A first illustrative embodiment will be described with reference to FIGS. 1 to 7.

1. Configuration of Laser Printer

Figure 1:
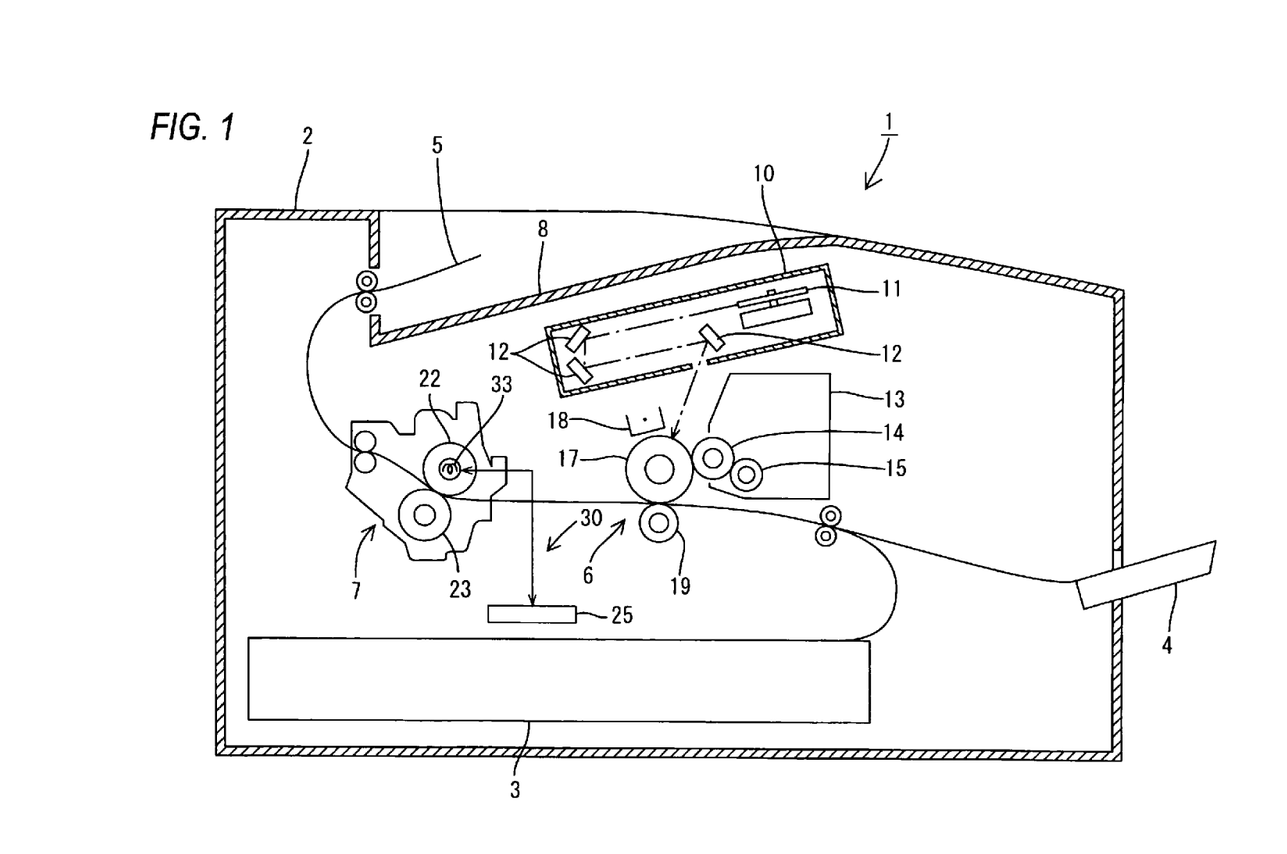
FIG. 1 is a sectional side view illustrating a schematic configuration of an image forming apparatus according to a first illustrative embodiment.

FIG. 1 is a view schematically illustrating a vertical section of a monochrome laser printer 1 which is an example of an image forming apparatus according to the first illustrative embodiment. The image forming apparatus is not limited to the monochrome laser printer and may be, for example, a color laser printer, a color LED printer, a multi-function apparatus, and the like.

In the monochrome laser printer (hereinafter, referred to simply as 'a printer') 1, an image forming unit 6 forms a toner image on a sheet 5 supplied from a tray 3 disposed at a lower portion or a tray 4 disposed on a side face in a main body casing 2, a fixing unit 7 performs a fixing process by heating the toner image, and finally, the sheet 5 is discharged to a discharge tray 8 positioned at an upper portion in the main body casing 2.

The image forming unit 6 includes a scanner unit 10, a development cartridge 13, a photosensitive drum 17, a charger 18, and a transfer roller 19.

The scanner unit 10 is disposed at the upper portion in the main body casing 2 and includes a laser emission unit (not shown), a polygon mirror 11, a plurality of reflective mirrors 12, a plurality of lenses (not shown), and the like. In the scanner unit 10, a laser beam emitted the laser emission unit is irradiated onto a surface of the photosensitive drum 17 through the polygon mirror 11, the reflective mirrors 12 and the lenses as shown by an alternate long and short dash line, so that high-speed scanning is performed.

The development cartridge 13 has toner accommodated therein. At a toner feed opening of the development cartridge 13, a developing roller 14 and a feeding roller 15 are provided to face each other, and the developing roller 14 is disposed to face the photosensitive drum 17. The toner in the development cartridge 13 is fed to the developing roller 14 by rotation of the feeding roller 15, to be held on the developing roller 14.

Above the photosensitive drum 17, the charger 18 is disposed with a gap. Further, below the photosensitive drum 17, the transfer roller 19 is disposed to face the photosensitive drum 17.

The surface of the photosensitive drum 17 is first uniformly charged to, for example, a positive polarity, by the charger 18 while rotating. Next, an electrostatic latent image is formed on the photosensitive drum 17 by the laser beam from the scanner unit 10. Thereafter, if the photosensitive drum 17 comes into contact with the developing roller 14 and rotates, the toner held on the developing roller 14 is fed to the electrostatic latent image on the surface of the photosensitive drum 17 and is held on the surface of the photosensitive drum 17 such that a toner image is formed. Thereafter, when a sheet 5 passes between the photosensitive drum 17 and the transfer roller 19, the toner image is transferred onto the sheet 5 by a transfer bias applied to the transfer roller 19.

The fixing unit 7 is disposed on a downstream side of the image forming unit 6 in a sheet conveyance direction, and the fixing unit 7 includes a fixing roller 22, a pressing roller 23 for pressing the fixing roller 22, a halogen heater 33 for heating the fixing roller 22, and the like. The halogen heater 33 is connected to a circuit board 25, and energization of the halogen heater 33 is controlled by a signal from the circuit board 25.

Figure 2:
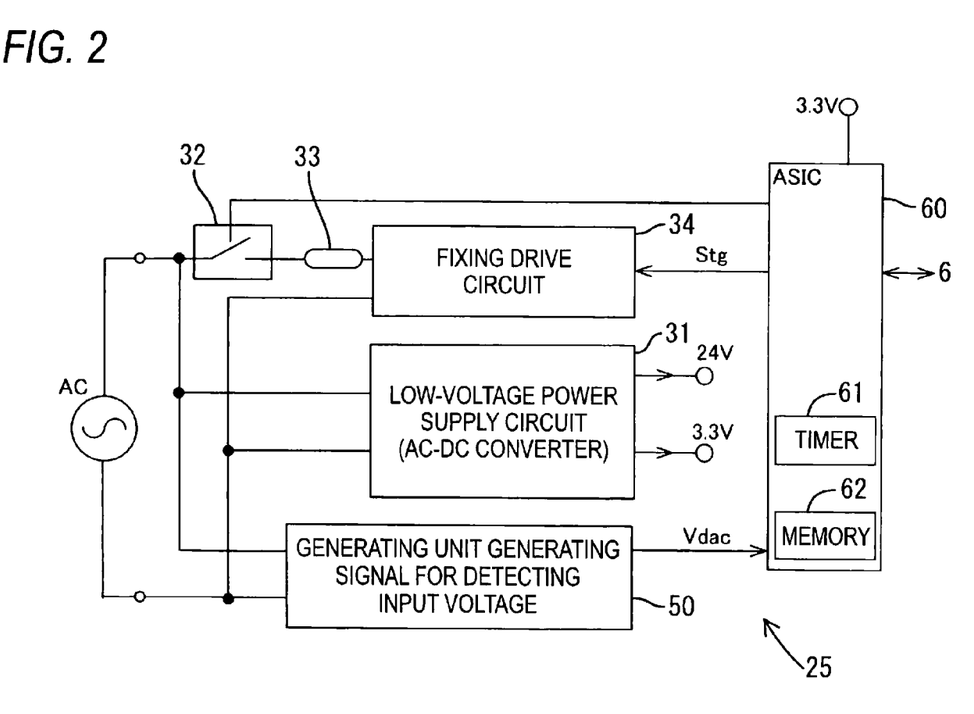
FIG. 2 is a block diagram illustrating a schematic configuration of a circuit relative to driving of a fixing unit.

As shown in FIG. 2, the circuit board 25 includes a low-voltage power supply circuit (an AC-DC converter) 31, a fixing relay 32, a fixing drive circuit 34, a generating unit 50 generating a signal for detecting an input voltage, and an application specific integrated circuit (ASIC) 60.

For example, the low-voltage power supply circuit 31 converts an AC voltage of 100 V into DC voltages of 24 V and 3.3 V, and the low-voltage power supply circuit 31 supplies the DC voltages to individual components. The halogen heater 33 generates heat according to energization of an AC power supply AC.

The fixing relay 32 is provided between the AC power supply AC and the halogen heater 33, and connects or disconnects the AC power supply AC to or from the halogen heater 33.

The fixing drive circuit 34 includes, for example, a TRIAC, and controls a conduction angle of the TRIAC on the basis of a trigger pulse signal Stg supplied from the ASIC 60, so that the halogen heater 33 is driven.

The ASIC 60 includes a timer 61, a memory 62, and the like, and detects an AC input voltage Vac of the AC power supply AC. Also, the ASIC 60 detects zero-crossing points ZP of the AC power supply AC. Further, the ASIC 60 generates a zero-crossing signal on the basis of the zero-crossing points ZP, and generates the trigger pulse signal Stg on the basis of the zero-crossing signal. The ASIC 60 supplies the trigger pulse signal Stg to the fixing drive circuit 34, such that energization of the fixing unit 7 is controlled. In addition, the ASIC 60 performs various kinds of control regarding image formation.

The timer 61 is used for time measurement when the zero-crossing points ZP are detected to detect the AC input voltage Vac. The memory 62 includes a ROM and a RAM. The ROM stores various programs to be executed by the ASIC 60, and the RAM stores various kinds of data when a program is executed.

2. Configuration of AC Voltage Detecting Circuit

Figure 3:
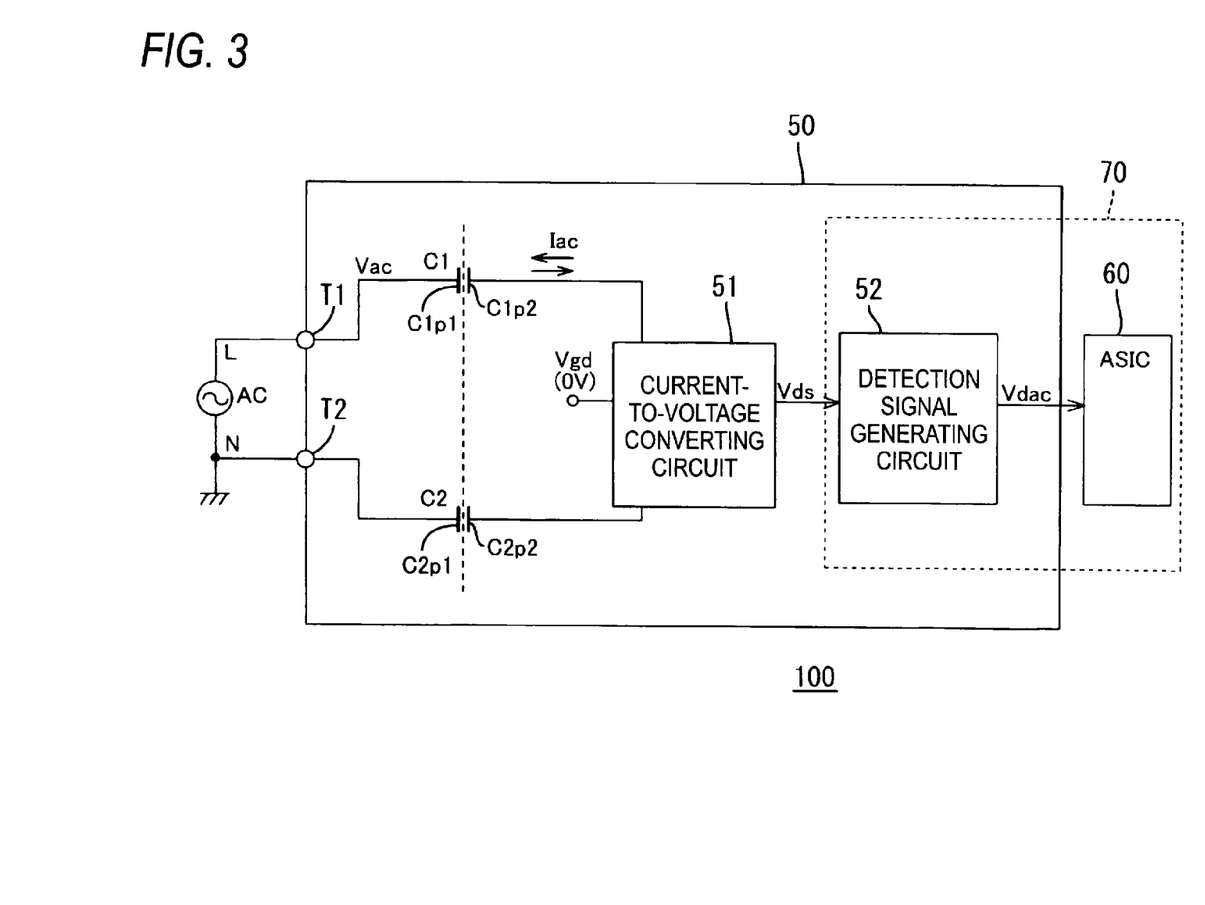
FIG. 3 is a block diagram illustrating a basic configuration of an AC voltage detecting circuit.

Next, an AC voltage detecting circuit 100 provided to the printer 1 will be described with reference to FIGS. 3 to 7. FIG. 3 is a block diagram illustrating a basic circuit configuration of the AC voltage detecting circuit 100.

The AC voltage detecting circuit 100 is configured by the generating unit 50 generating a signal for detecting an input voltage and the ASIC 60. The AC voltage detecting circuit 100 is provided to the printer 1, and but this disclosure is not limited thereto. Further, the ASIC 60 is an example of an arithmetic circuit of a voltage detecting unit; however, the arithmetic circuit is not limited to the ASIC 60. For example, the arithmetic circuit may be configured by a CPU or a separate logic circuit.

The generating unit 50 generating a signal for detecting an input voltage (hereinafter, referred to simply as 'a detection signal generating unit 50') includes a first capacitor C1, a second capacitor C2, an current-to-voltage converting circuit 51, and a detection signal generating circuit 52, as shown in FIG. 3.

The first capacitor C1 includes a first electrode C1$p$1 and a second electrode C1$p$2, the first electrode C1$p$1 is connected to one end of the AC power supply AC, and the second electrode C1$p$2 is connected to the current-to-voltage converting circuit 51. As shown in FIG. 3, the first electrode C1$p$1 of the first capacitor C1 is connected to a live-side power line L of the AC power supply AC that is the one end of the AC power supply AC.

The second capacitor C2 includes a first electrode C2$p$1 and the second electrode C2$p$2, the first electrode C2$p$1 is connected to the other end of the AC power supply AC, and the second electrode C2$p$2 is connected to the current-to-voltage converting circuit 51. As shown in FIG. 3, the first electrode C2$p$1 of the second capacitor C2 is connected to a neutral-side power line N of the AC power supply AC which is the other end of the AC power supply AC. The neutral-side power line N is grounded.

The current-to-voltage converting circuit 51 is connected in series between the second electrode C1$p$2 of the first capacitor C1 and the second electrode C2$p$2 of the second capacitor C2, and the current-to-voltage converting circuit 51 converts an AC current Iac output from the AC power supply AC into an AC voltage Vds for detection with causing the AC current Iac to pass the current-to-voltage converting circuit 51 when the AC current Iac returns to the AC power supply AC. Further, the current-to-voltage converting circuit 51 is connected to a reference potential Vgd. Here, the reference potential Vgd is set to 0 V (zero V).

The detection signal generating circuit 52 generates a voltage detection signal Vdac for detecting the AC input voltage Vac based on the AC voltage Vds for detection. The ASIC 60 calculates the AC input voltage Vac based on the voltage detection signal Vdac. The detection signal generating circuit 52 and the ASIC 60 configure a voltage detecting unit 70.

As described above, in this AC voltage detecting circuit 100, instead of a photocoupler, the first capacitor C1, the second capacitor C2, and the current-to-voltage converting circuit 51, which is connected in series between the second electrode C1$p$2 of the first capacitor C1 and the second electrode C2$p$2 of the second capacitor C2 and is connected to the reference potential Vgd, convert the AC current Iac into the AC voltage Vds for detection. When the AC current Iac output from the AC power supply AC returns to the AC power supply AC, the current-to-voltage converting circuit 51 converts the AC current Iac into the AC voltage Vds for detection with causing the AC current Iac to pass the current-to-voltage converting circuit 51. Therefore, for example, in a case where the current-to-voltage converting circuit 51 is configured by one AC voltage converting resistor and a bridge circuit configured by four diodes, it is possible to reduce a current flowing in the current-to-voltage converting circuit 51, as compared to a drive current of a photocoupler. Therefore, it becomes possible to further save electric power, as compared to a case of detecting the AC input voltage Vac by using a photocoupler.

3. AC Voltage Detecting Circuit

Hereinafter, an AC voltage detecting circuit 100A according to the first illustrative embodiment will be described with reference to FIGS. 4 to 7. In the following description, unless otherwise noted, detecting or calculating the AC input voltage Vac means detecting or calculating the maximum value or effective value of the AC input voltage Vac, and does not mean detecting or calculating a momentary value of the AC input voltage Vac.

Figure 4:
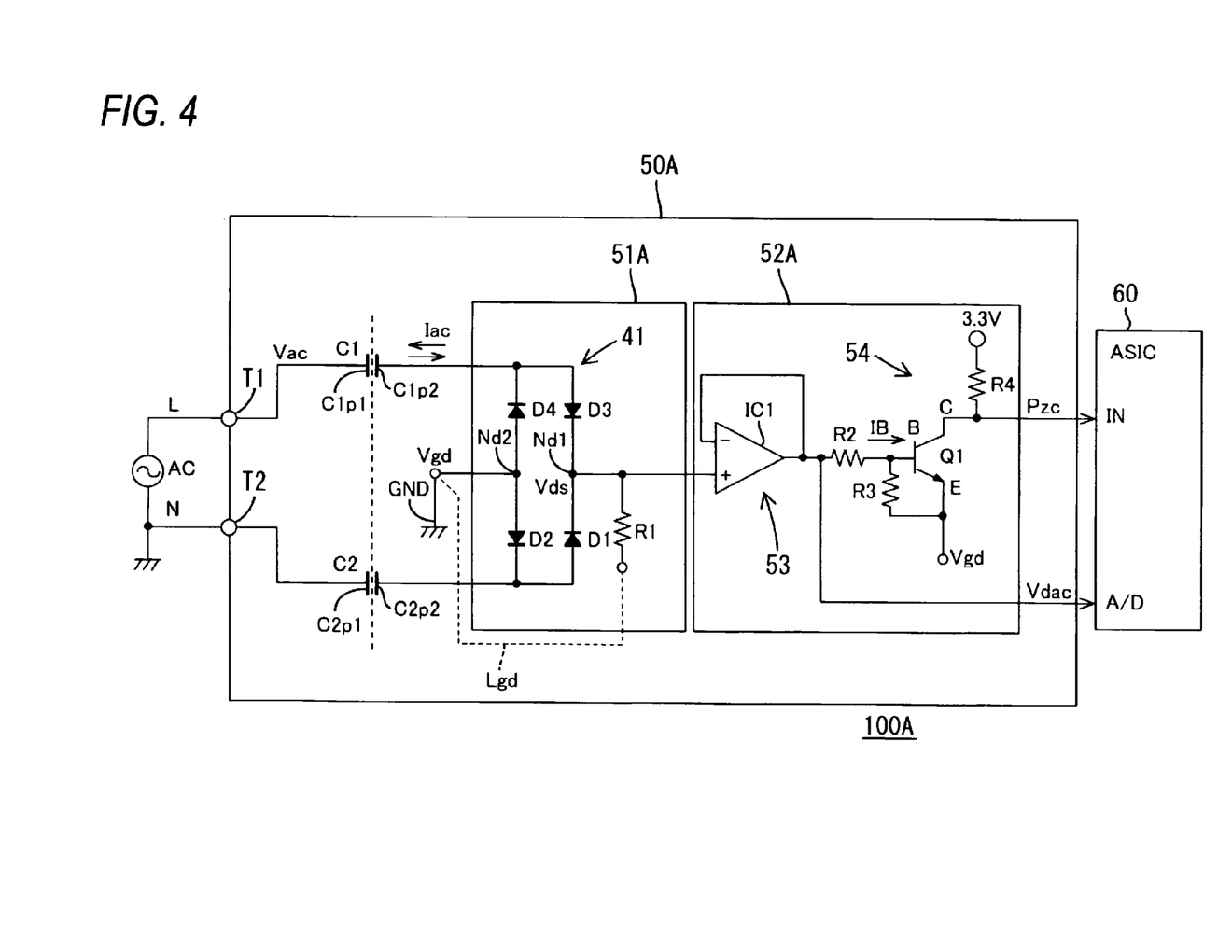
FIG. 4 is a block diagram illustrating a configuration of an AC voltage detecting circuit according to the first illustrative embodiment.

FIG. 4 illustrates the configuration of the AC voltage detecting circuit 100A of the first illustrative embodiment. As shown in FIG. 4, the live-side power line L of the AC power supply AC is connected to a power supply terminal T1 of a detection signal generating unit 50A, and the neutral-side power line N of the AC power supply AC is connected to a power supply terminal T2 of the detection signal generating unit 50A. The neutral-side power line N is grounded. In the example shown in FIG. 4, the printer 1 is connected to a frame ground, and a reference potential line Lgd with the reference potential Vgd (0 V) of the AC voltage detecting circuit 100A is grounded through a ground line GND. Hereinafter, a case where the printer 1 is grounded through the ground line GND is referred to simply as a frame-ground, and a case where the printer 1 is not grounded is referred to simply as non-frame-ground.

Also, a current-to-voltage converting circuit 51A of the first illustrative embodiment includes a bridge circuit 41 and a resistor R1. As shown in FIG. 4, the bridge circuit 41 is configured by four diodes D1, D2, D3, and D4. Cathodes of the diode D1 and the diode D3 are connected at a first contact node Nd1, an anode of the diode D1 is connected to the second electrode C2p2 of the second capacitor C2, and an anode of the diode D3 is connected to the second electrode C1p2 of the first capacitor C1.

Further, anodes of the diode D2 and the diode D4 are connected at a second contact node Nd2, a cathode of the diode D2 is connected to the second electrode C2p2 of the second capacitor C2, and a cathode of the diode D4 is connected to the second electrode C1p2 of the first capacitor C1. The second contact node Nd2 is grounded through the ground line GND. In a case of the non-frame-ground, the second contact node Nd2 is not grounded and is set to the reference potential Vgd (0 V).

In this case, a series circuit of the diodes D2 and D4 and a series circuit of the diodes D1 and D3 configure a pair of series circuits, each of which is configured by two circuit elements. The first contact node Nd1 and the second contact node Nd2 correspond to the contact nodes of the circuit elements.

Further, one end of the resistor R1 is connected to the first contact node Nd1, and the other end of the resistor R1 is connected to the reference potential Vgd (0 V).

The configuration of the bridge circuit 41 is not limited to the configuration of four diodes shown in FIG. 4. For example, the diodes D2 and D4 or the diodes D1 and D3 may be replaced with a resistor. As another alternative, the diodes D1 and D4 may be replaced with resistors. Also, the diodes D3 and D4 may be replaced with capacitors.

In this case, in a positive cycle of the AC input voltage Vac, the AC current Iac from the AC power supply AC flows in the first capacitor C1, the diode D3, the resistor R1, and the ground line GND in this order and then returns to the AC power supply AC. Meanwhile, in a negative cycle of the AC input voltage Vac, the AC current Iac from the AC power supply AC flows in the ground line GND, the diode D4, and the first capacitor C1 in this order and then returns to the AC power supply AC.

In a case where the neutral-side power line N is connected to the power supply terminal T1, and the live-side power line L is connected to the power supply terminal T2, in a positive cycle of the AC input voltage Vac, the AC current Iac from the AC power supply AC flows in the second capacitor C2, the diode D1, the resistor R1, and the ground line GND in this order and then returns to the AC power supply AC. Meanwhile, in a negative cycle of the AC input voltage Vac, the AC current Iac from the AC power supply AC flows in the ground line GND, the diode D2, and the second capacitor C2 in this order and then returns to the AC power supply AC.

Figure 7:
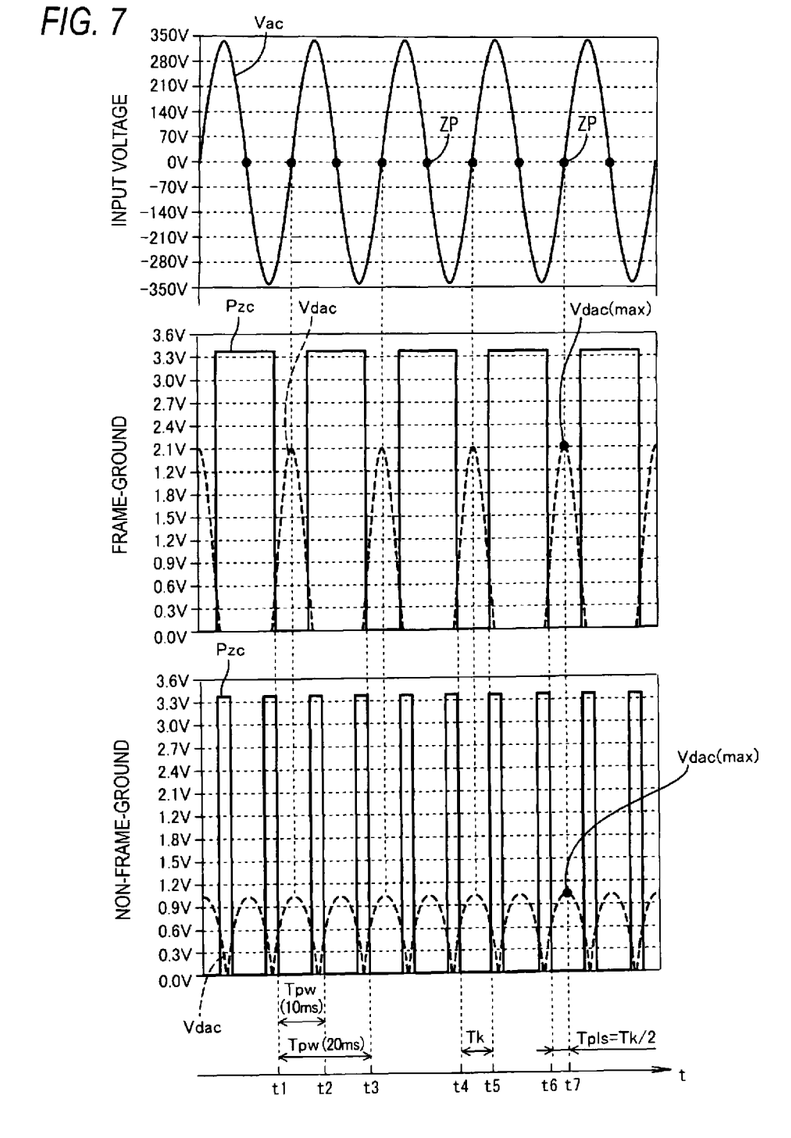
FIG. 7 is a timing chart illustrating respective signals according to the first illustrative embodiment.

In these cases, that is, in a case of the frame-ground, the waveform of the AC voltage Vds for detection, which is the voltage at the first contact node Nd1, becomes a waveform obtained by half-wave rectifying the AC input voltage Vac by the bridge circuit 41 (see FIG. 7).

In the case non-frame-ground, a case where the ground line GND is not grounded will be described below.

In the case where the live-side power line L of the AC power supply AC is connected to the power supply terminal T1, and the neutral-side power line N of the AC power supply AC is connected to the power supply terminal T2, in a positive cycle of the AC input voltage Vac, the AC current Iac from the AC power supply AC flows in the first capacitor C1, the diode D3, the resistor R1, the reference potential line Lgd, the diode D2, and the second capacitor C2 in this order and then returns to the AC power supply AC.

Meanwhile, in a negative cycle of the AC input voltage Vac, the AC current Iac from the AC power supply AC flows in the second capacitor C2, the diode D1, the resistor R1, the reference potential line Lgd, the diode D4, and the first capacitor C1 in this order and then returns to the AC power supply AC.

Even in the case where the neutral-side power line N of the AC power supply AC is connected to the power supply terminal T1, and the live-side power line L is connected to the power supply terminal T2, the current paths in a positive cycle and a negative cycle are just reversed, and similarly, the AC current Iac flows through the first contact node Nd1 in a positive cycle and a negative cycle. In other words, in a case of the non-frame-ground, the waveform of the AC voltage Vds for detection becomes a waveform obtained by full-wave rectifying the AC input voltage by the bridge circuit 41 (see FIG. 7).

A detection signal generating circuit 52A includes a voltage follower 53 and a signal converting circuit 54.

The voltage follower 53 is configured by an operational amplifier IC1, and the voltage follower 53 receives the AC voltage Vds for detection from the current-to-voltage converting circuit 51A, and outputs the voltage detection signal Vdac that is the similar as the AC voltage Vds for detection. The voltage detection signal Vdac is supplied to an A/D port of the ASIC 60.

The ASIC 60 calculates the AC input voltage based on the voltage detection signal Vdac output from the voltage follower 53. The A/D port includes an A/D converting circuit for converting the voltage detection signal Vdac, which is an analog signal, into a digital signal. As described above, if the voltage follower 53 is used, it is possible to stabilize the voltage detection signal Vdac, so that the AC input voltage Vac is stably detected.

The signal converting circuit 54 is connected at the subsequent stage of the voltage follower 53, and the signal converting circuit 54 converts the voltage detection signal Vdac into a pulse signal Pzc. In the first illustrative embodiment, the ASIC 60 detects the zero-crossing points ZP of the AC power supply AC by using the pulse period Tpw of the pulse signal Pzc and then calculates the AC input voltage Vac based on the zero-crossing points ZP (see FIG. 7).

As shown in FIG. 4, the signal converting circuit 54 includes a transistor Q1, a current limiting resistor R2, and a pull-up resistor R4. A current shunt resistor R3 is appropriately disposed for adjustment of a base current of the transistor Q1 and a stable operation of the transistor Q1. Here, the transistor Q1 is used as a switching transistor to perform a switching operation according to a base current IB. Further, a case that the transistor Q1 is an NPN transistor is described. However, the transistor Q1 is not limited to a NPN transistor. Furthermore, the configuration of the signal converting circuit 54 for converting the AC voltage Vds for detection into the pulse signal Pzc is not necessarily limited to the configuration of the transistor Q1 and the resistors R2, R3, and R4.

The NPN transistor (hereinafter, referred to simply as 'a transistor') Q1 includes a collector C connected to one end of the resistor R4, a base B connected to a contact node between the resistors R2 and R3, and an emitter E connected to the reference potential Vgd. The resistor R4 is a pull-up resistor, and the other end of the resistor R4 is connected to a DC power supply DC of 3.3 V.

The transistor Q1 is turned on or off according to the base current IB supplied to the base B. Further, the pulse signal Pzc is output from the collector C of the transistor Q1, and becomes 0 V when the transistor Q1 is on, and becomes 3.3 V when the transistor Q1 is off (see FIG. 7).

4. Process of Detecting AC Input Voltage

Figure 5:
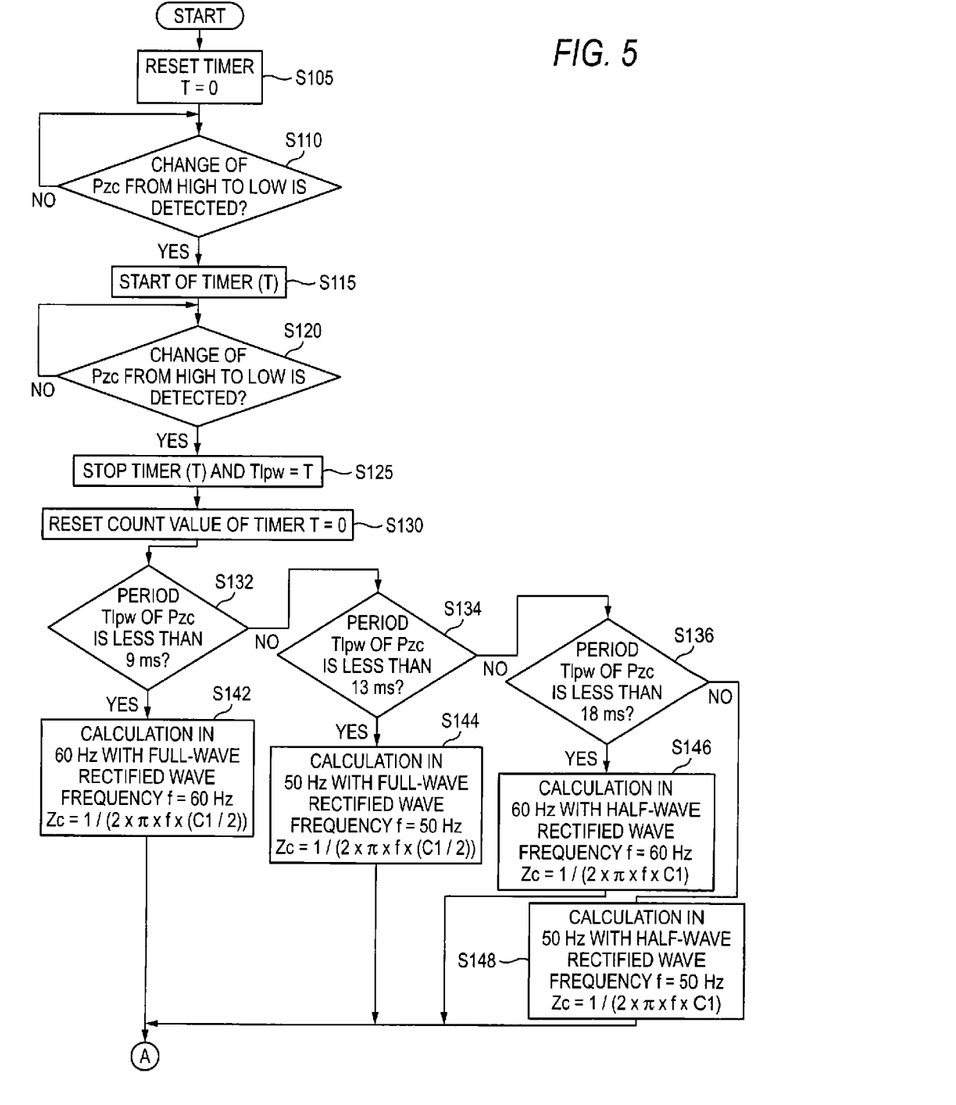
FIG. 5 is a flow chart illustrating an AC voltage detecting process according to the first illustrative embodiment.
Figure 6:
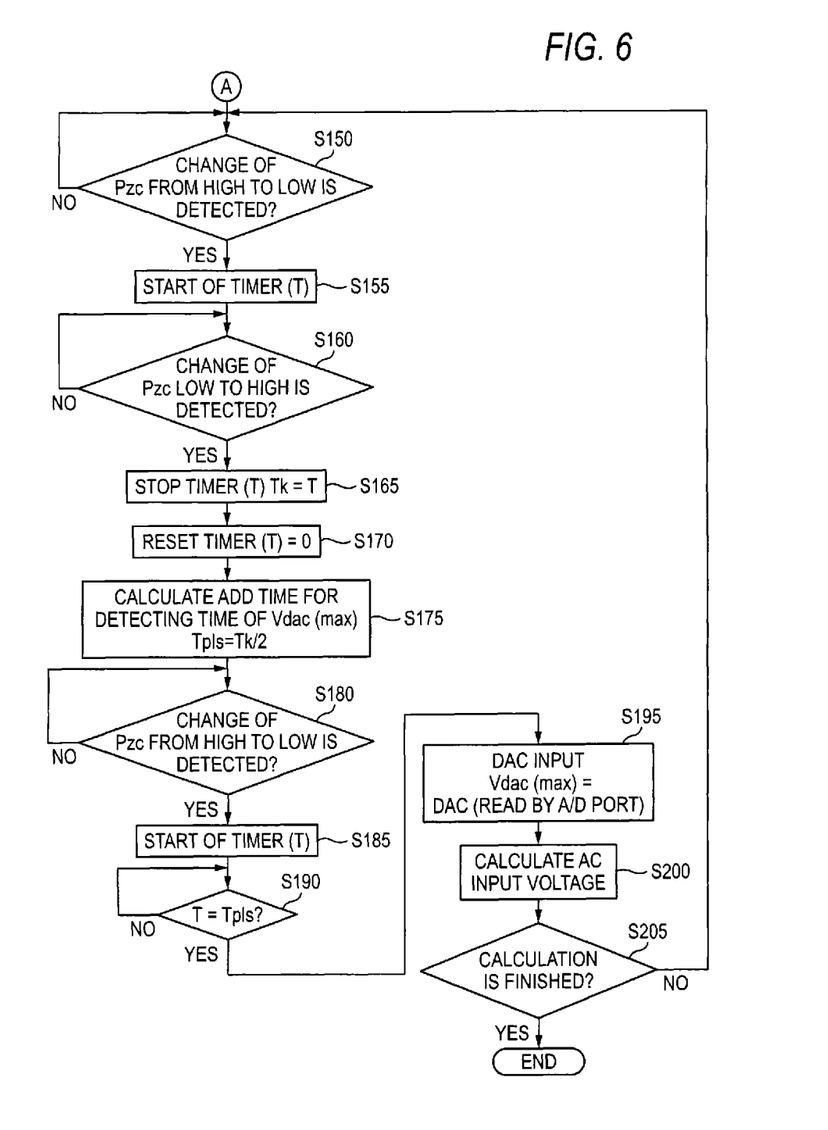
FIG. 6 is a flow chart illustrating the AC voltage detecting process according to the first illustrative embodiment.

Next, a process of detecting the AC input voltage Vac according to the first illustrative embodiment will be described with reference to FIGS. 5 to 7. FIGS. 5 and 6 are flow charts illustrating a process of detecting the AC input voltage, and FIG. 7 is a timing chart illustrating respective signals regarding the process of detecting the AC input voltage. For example, when power is supplied to the printer 1, the ASIC 60 performs the process of detecting the AC input voltage according to a predetermined program stored in a ROM 62.

If the process starts, first, in step S105, the ASIC 60 resets a count value T of the timer 61. Next, in step S110, the ASIC 60 determines whether a change of the pulse signal Pzc from a high level (H) to a low level (L), that is, a change from 3.3 V to 0.0 V is detected. If it is determined that a change of the pulse signal Pzc from the high level to the low level is detected (YES in step S110), the ASIC 60 starts time measurement of the timer 61 in step S115. This time point is corresponding to a time t1 of FIG. 7, for example.

Next, in step S120, again, the ASIC 60 determines whether a change of the pulse signal Pzc from the high level to the low level is detected. If it is determined that a change of the pulse signal Pzc from the high level to the low level is detected (YES in step S120), in step S125, the ASIC 60 stops the time measurement of the timer 61, and the measured value Tpw is set in that time. For example, This time point is corresponding to a time t2 of FIG. 7 in a case of the frame-ground and corresponds to a time t3 of FIG. 7 in a case of the non-frame-ground. Next, in step S130, the ASIC 60 resets the timer 61.

The measured value Tpw corresponds to the period of the pulse signal Pzc as shown in FIG. 7. In a case of the frame-ground, since the voltage detection signal Vdac is a half-wave rectified wave, if a power supply frequency f is 60 Hz, the measured value Tpw becomes almost 16.7 ms (milliseconds), and if the power supply frequency f is 50 Hz, the measured value Tpw becomes 20.0 ms. Meanwhile, in a case of the non-frame-ground, since the voltage detection signal Vdac is a full-wave rectified wave, if the power supply frequency f is 60 Hz, the measured value Tpw becomes almost 8.35 ms (milliseconds), and if the power supply frequency f is 50 Hz, the measured value Tpw becomes 10.0 ms.

In other words, it is possible to determine the power supply frequency f and whether a frame ground is present or not based on the measured value Tpw, and thus it is possible to determine circuit impedance for calculating of the AC input voltage Vac. Specifically, it is possible to determine a total capacitance Ct according to the first and second capacitors C1 and C2 and to determine impedance Zc according to the total capacitance Ct.

Therefore, if the period Tpw of the pulse signal Pzc is less than 9 ms for example (YES in step S132), the ASIC 60 determines that it is in the non-frame-ground and the power supply frequency f for acquiring the impedance Zc is determines 60 Hz. Further, in a case of the non-frame-ground, since the first and second capacitors C1 and C2 configures the circuit impedance, in a case where the capacitances C1 and C2 of the first and second capacitors C1 and C2 are equal to each other, in step S142, the ASIC 60 sets the total capacitance Ct as C1/2, and calculates the impedance Zc by following Equation 1.

$$Zc=1/(2\times\pi\times f\times(C1/2))$$  Equation 1

Meanwhile, for example, in a case where the period Tpw of the pulse signal Pzc is equal to or greater than 9 ms and is less than 13 ms (NO in step S132, and YES in step S134), the ASIC 60 determines that the power supply frequency f for acquiring the impedance Zc is 50 Hz. Similarly, in step S144, the ASIC 60 sets the total capacitance Ct as C1/2, and calculates the capacitance impedance Zc by Equation 1.

Meanwhile, for example, if the period Tpw of the pulse signal Pzc is equal to or greater than 13 ms and is less than 18 ms (NO in step S134, and YES in step S136), the ASIC 60 determines that it is in the frame-ground and the power supply frequency f for acquiring the impedance Zc is 60 Hz. Further, in a case of the frame-ground, since any one of the first and second capacitors C1 and C2 configures the circuit impedance, if the capacitances C1 and C2 of the first and second capacitors C1 and C2 are equal to each other, in step S146, the ASIC 60 sets the total capacitance Ct as C1, and calculates the impedance Zc by Equation 2.

$$Zc=1/(2\times\pi\times f\times C1)$$  Equation 2

For example, in a case where the period Tpw of the pulse signal Pzc is equal to or greater than 18 ms (NO in step S136), the ASIC 60 determines a frame-ground, and determines 50 Hz as the power supply frequency f for acquiring the impedance Zc. Similarly, in step S148, the ASIC 60 sets the total capacitance Ct as C1, and calculates the impedance Zc by Equation 2.

Next, in step S150, again, the ASIC 60 determines whether a change of the pulse signal Pzc from the high level to the low level is detected. If it is determined that a change of the pulse signal Pzc from the high level to the low level is detected (YES in step S150), the ASIC 60 starts the time measurement of the timer 61 in step S155. This time point is corresponding to a time t4 of FIG. 7, for example.

Next, in step S160, the ASIC 60 determines whether a change of the pulse signal Pzc from the low level to the high level is detected. If it is determined that a change of the pulse signal Pzc from the low level to the high level is detected (YES in step S160), in step S165, the ASIC 60 stops the time measurement of the timer 61, and the measured value Tk is set in that time. This time point is corresponding to a time t5 of FIG. 7, for example. Next, in step S170, the ASIC 60 resets the timer 61.

Next, in step S175, the ASIC 60 calculates an add time Tpls for detecting a time, in which the voltage detection signal Vdac becomes a maximum value Vdac (max) by Tpls=Tk/2.

Next, in step S180, again, the ASIC 60 determines whether a change of the pulse signal Pzc from the high level to the low level is detected. If it is determined that a change of the pulse signal Pzc from the high level to the low level is detected (YES in step S180), the ASIC 60 starts time measurement of the timer 61 start in step S185. This time point is corresponding to a time t6 of FIG. 7, for example.

Next, in step S190, the ASIC 60 determines whether the count value of the timer 61 is Tpls. If it is determined that the count value is Tpls (YES in step S190), in step S195, the ASIC 60 sets the value of the voltage detection signal Vdac (a read value at the A/D port) as the maximum value Vdac(max) in that time. This time point is corresponding to a time t7 of FIG. 7, for example. Next, in step S200, the ASIC 60 calculates the AC input voltage Vac based on the maximum value Vdac (max). The time t7 corresponds to a zero-crossing point ZP of the AC input voltage Vac as shown in FIG. 7. In other words, the ASIC 60 detects the zero-crossing points ZP of the AC power supply by using the pulse period Tpw of the pulse signal Pzc and calculates the AC input voltage Vac based on the zero-crossing points ZP.

Next, in step S205, the ASIC 60 determines whether the predetermined process of calculating the AC input voltage Vac has completely finished. If it is determined that the predetermined calculating process has not completely finished (NO in step S205), the process returns to step S150. On the other hand, if it is determined that the predetermined calculating process has completely finished (YES in step S205), the present process of calculating the AC input voltage finishes. The calculated AC input voltage Vac can be used to control the temperature of the fixing unit 7.

Hereinafter, the process of calculating the AC input voltage Vac in step S200 will be described in detail. The maximum value Vdac(max) recognized by the ASIC 60 is the similar as the maximum value Vds(max) of the AC voltage Vds for detection being the voltage at the first contact node Nd1 and corresponds to a value to be obtained as the voltage maximum value at the first contact node Nd1 by the following Equation 3.

Here, the resistance value of the resistor R1 is set as R1, and the effective value of the AC input voltage Vac is set as Vac(rms). Further, since the capacitance impedance Zc is sufficiently larger than impedance Zr by the resistor R1 and also the AC input voltage Vac is sufficiently larger than a voltage drop Vf of each diode, in Equation 3, the impedance Zr and the voltage drop Vf are to be disregarded. Furthermore, the capacitance impedance Zc becomes $1/(\omega Ct)$, more specifically, becomes $1/(\omega C1)$ or $1/(\omega C2)$ in a case of the frame-ground, and becomes $1/(\omega \times (C1 \times C2/(C1+C2)))$ in a case of the non-frame-ground. Here, Ct is the total capacitance, and $\omega$ is $2\pi f$.

$$Vdac(max)=(\sqrt{2}\times Vac(rms)/Zc)\times R1 \quad \text{Equation 3}$$

Next, from Equation 3, the ASIC 60 calculates the value of the AC input voltage Vac, that is, the effective value Vac(rms) of the AC input voltage Vac as the following Equation.

$$Vac(rms)=Vdac(max)\times Zc/(\sqrt{2}\times R1) \quad \text{Equation 4}$$

FIG. 7 illustrates respective waveforms in a case where the effective value

Vac(rms) of the AC input voltage Vac is 240V, the power supply frequency f is 50 Hz, the capacitances C1 and C2 are 1000 pF (pico-farads), and the resistance value R1 is 20 kΩ. In this case, in a case of the frame-ground, the maximum value Vdac(max) becomes 2.132V, and the effective value Vac(rms) is calculated from Equation 4 as 239.7 V. Meanwhile, in a case of the non-frame-ground, the maximum value Vdac(max) becomes 1.067 V, and the effective value Vac (rms) is calculated from Equation 4 as 240.3 V. Therefore, it is confirmed that any calculated effective value Vac(rms) of the AC input voltage is almost equal to the actual effective value Vac(rms) of the AC input voltage.

5. Effects of First Illustrative Embodiment

Since the AC input voltage Vac is calculated based on detection of the zero-crossing points ZP, it is possible to detect the maximum value Vac(max) of the AC input voltage in real time. Further, it is possible to simply detect the maximum value Vac(max) of the AC input voltage with saving power, as compared to a case of performing detection of the zero-crossing points ZP by using a photocoupler.

Also, the ASIC 60 changes the circuit impedance Zc for calculating the AC input voltage Vac according to the pulse period Tpw of the pulse signal Pzc. Therefore, even in a case where it is impossible to acquire information on the power supply frequency f and whether there is the frame-ground, it is possible to appropriately detect the AC input voltage Vac.

In the first illustrative embodiment, the AC input voltage Vac is calculated based on the detection of the zero-crossing points ZP. However, this disclosure is not limited thereto. In other words, the detection signal generating circuit 52A may be configured not to include the signal converting circuit 54. Even in this case, for example, if the voltage detection signal Vdac is sampled by the A/D port of the ASIC 60 at predetermined sampling intervals that is sufficiently smaller than the period of the AC input voltage Vac, it is possible to detect the maximum value Vac(max) of the AC input voltage Vac.

Further, the voltage follower 53 may be not necessary and may be omitted. In other words, the AC voltage Vds for detection may be input directly to the A/D port of the ASIC 60, so that the AC input voltage is detected.

Second Illustrative Embodiment

Figure 8:
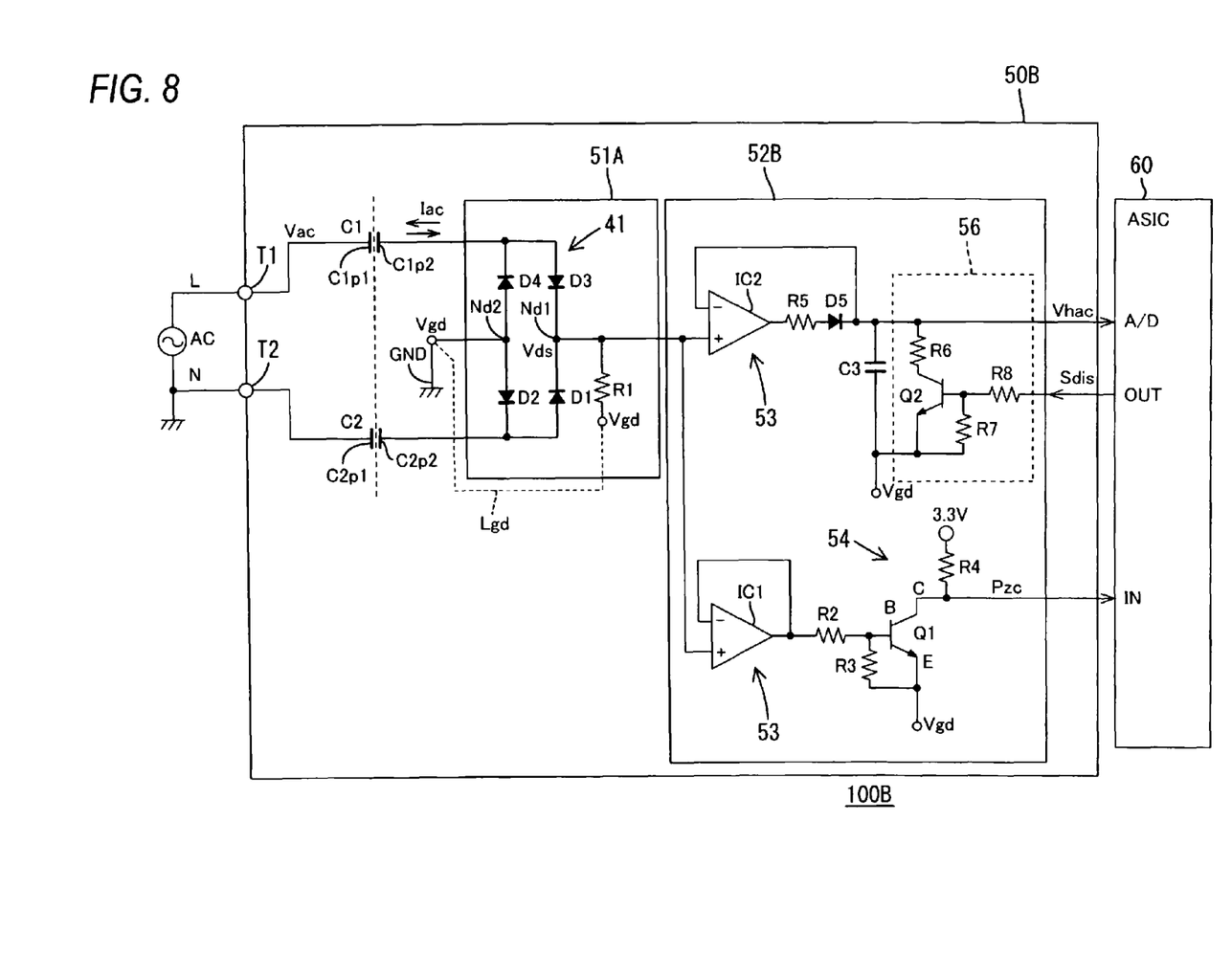
FIG. 8 is a block diagram illustrating a configuration of an AC voltage detecting circuit according to a second illustrative embodiment.

Next, a second illustrative embodiment of the AC voltage detecting circuit 100 will be described with reference to FIG. 8. FIG. 8 illustrates a configuration of an AC voltage detecting circuit 100B according to the second illustrative embodiment. The second illustrative embodiment is different from the first illustrative embodiment mainly in the configuration of the detection signal generating circuit 52 of the generating unit 50 generating a signal for detecting an input voltage. Accordingly, this difference will be mainly described. Identical components are denoted by the same reference symbols and will not be described.

A detection signal generating circuit 52B of the AC voltage detecting circuit 100B of the second illustrative embodiment is different from the detection signal generating circuit 52A of the first illustrative embodiment in that the detection signal generating circuit 52B includes a peak holding circuit 55 and a discharging circuit 56.

The peak holding circuit 55 includes an operational amplifier IC2, a resistor R5, a diode D5, and a capacitor C3. The peak holding circuit 55 is connected to the current-to-voltage converting circuit 51, and holds a peak of the AC voltage Vds for detection to generate a peak signal Vhac representing the maximum value Vds(max) of the AC voltage Vds for detection. The peak signal Vhac is input to the A/D port of the ASIC 60.

As described above, since the maximum value Vds(max) of the AC voltage Vds for detection is the similar as the maximum value Vdac(max) of the voltage detection signal Vdac, the ASIC 60 substitutes the detection maximum value Vds(max) into Equation 4, so that the effective value Vac (rms) of the AC input voltage is detected. In other words, even by providing the peak holding circuit 55, it is possible to simply detect the maximum value of the AC input voltage with saving power.

The discharging circuit 56 includes a transistor Q2 and resistors R6, R7, and R8. After the ASIC 60 detects the AC input voltage, the discharging circuit 56 discharges the charge of the capacitor C3 regarding the AC voltage Vds(max) held by the peak holding circuit 55. Specifically, in response to a discharge instruction signal Sdis from the ASIC 60, the discharging circuit 56 turns on the transistor Q2 so that the charge of the capacitor C3 is discharged. Therefore, it is possible to detect a new AC input voltage Vac.

Further, the pulse signal Pzc is generated by the voltage follower 53 and the signal converting circuit 52, and is supplied to the ASIC 60. Similarly to the first illustrative embodiment, the ASIC 60 calculates the impedance Zc based on the period Tpw of the pulse signal Pzc. Next, the ASIC 60 substitutes the AC voltage Vdac(max) obtained by the peak holding and the impedance Zc into Equation 4 and then calculates the effective value Vac(rms) of the AC input voltage Vac.

Also, the ASIC 60 controls the detection of the AC input voltage Vac based on the pulse signal Pzc. In other words, after the charge of the capacitor C3 is discharged and the voltage detection signal Vdac is input to the detection signal generating circuit 52B at least once, it is required to detect the voltage Vdac(max) obtained by holding the peak of the voltage detection signal Vdac. This timing may be, for example, a predetermined timeing after the discharging (20 ms in a case where half-wave rectification is performed and the power supply frequency f is 50 Hz), or may be a timing when a change of the pulse signal Pzc from the high level to the low level or from the low level to the high level is detected, after the pulse signal Pzc is detected, or the like.

Further, similarly to the first illustrative embodiment, the ASIC 60 detects the zero-crossing points ZP based on the pulse signal Pzc. Next, the ASIC 60 performs control on the temperature of the fixing unit 7 and the like based on the zero-crossing points ZP.

In the second illustrative embodiment, the discharging circuit 56 and the voltage follower 53 may be omitted. In other words, even if the discharging circuit 56 and the voltage follower 53 are omitted, it is possible to detect the AC input voltage Vac.

Other Illustrative Embodiments

This disclosure is not limited to the illustrative embodiments described with reference to the drawings, and but, for example, the following illustrative embodiments are included in the technical scope of this disclosure.

(1) In each of the above-mentioned illustrative embodiments, the current-to-voltage converting circuit 51 includes the bridge circuit 41. However, this disclosure is not limited to the configuration in which the current-to-voltage converting circuit 51 includes the bridge circuit 41. For example, like a current-to-voltage converting circuit 51B shown in FIG. 9, the current-to-voltage converting circuit 51 may be configured by omitting the diodes D4 and D3 from the bridge circuit 41 and by connecting the cathode of the diode D1 to the second electrode C1p2 of the first capacitor C1. Further, the diode D2 may be replaced with a resistor.

Figure 9:
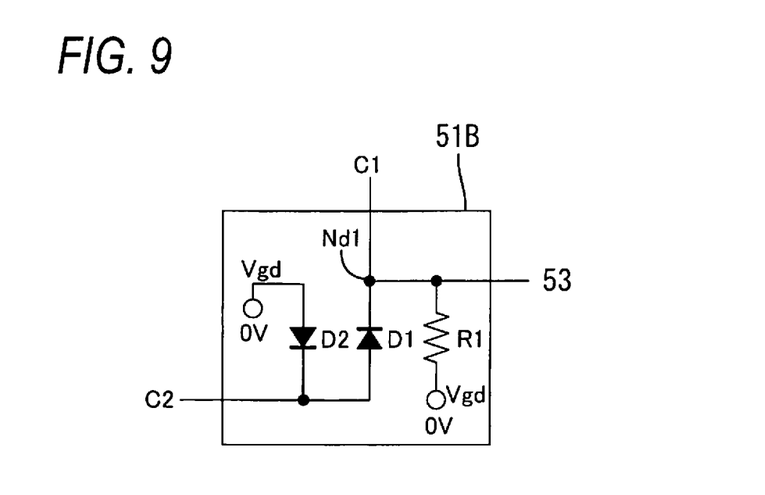
FIG. 9 is a circuit diagram illustrating another example of the current-to-voltage converting circuit.

That is, the current-to-voltage converting circuit 51 may be needed to be connected in series between the second electrode C1p2 of the first capacitor C1 and the second electrode C2p2 of the second capacitor C2 and to be connected to the reference potential Vgd, and the current-to-voltage converting circuit 51 may be needed to convert the AC current Iac output from the AC power supply AC into the AC voltage Vds for detection with causing the AC current Iac to pass the current-to-voltage converting circuit 51 when the AC current Iac returns to the AC power supply AC.

According to this disclosure, instead of using a photocoupler, the first capacitor, the second capacitor, and the current-to-voltage converting circuit, which is connected in series between the second electrode of the first capacitor and the second electrode of the second capacitor and is connected to the reference potential, are used, and the current-to-voltage converting circuit causes the AC current to pass through the current-to-voltage converting circuit when the AC current returns to the AC power supply and converts the AC current output from the AC power supply AC into the detection AC voltage, so that the AC input voltage is detected Accordingly, in a case where the current-to-voltage converting circuit is configured by one AC voltage converting resistor and a bridge circuit configured by four diodes, it is possible to reduce a current flowing in the current-to-voltage converting circuit, as compared to a drive current of a photocoupler. Therefore, it becomes possible to further save electric power, as compared to a case of detecting the AC input voltage by using a photocoupler.

What is claimed is:

1. An AC voltage detecting circuit comprising:
a first capacitor including a first electrode configured to connect to one end of an AC power supply, and a second electrode;
a second capacitor including a first electrode configured to connect to another end of the AC power supply, and a second electrode;
a current-to-voltage converting circuit, which is connected in series between the second electrode of the first capacitor and the second electrode of the second capacitor, and which is connected to a reference potential, wherein the current-to-voltage converting circuit includes a resistor and as AC current passes through the current-to-voltage converting circuit when the AC current returns to the AC power supply, the current-to-voltage converting circuit converts, by the resistor, the AC current output from the AC power supply into a detection AC voltage; and
a voltage detecting unit, which detects an AC input voltage of the AC power supply, based on the detection AC voltage;
wherein the voltage detecting unit includes:
a detection signal generating circuit, which generates a voltage detection signal for detecting the AC input voltage; and
an arithmetic circuit, which calculates the AC input voltage based on the voltage detection signal;
wherein the detection signal generating circuit includes a voltage follower, which receives the detection AC voltage from the current-to-voltage converting circuit and generates the voltage detection signal; and
wherein the detection signal generating circuit includes a signal converting circuit, which is connected at a subsequent stage of the voltage follower and converts the voltage detection signal into a pulse signal;
wherein the arithmetic circuit detects zero-crossing points of the AC power supply by using the pulse signal, and calculates the AC input voltage, based on a value of the voltage detection signal output from the voltage follower at the zero-crossing points;

wherein the arithmetic circuit uses an impedance of a circuit that includes at least one of the first capacitor and the second capacitor, and a value of the resistor; and wherein when calculating the AC input voltage, the arithmetic circuit changes the impedance according to the pulse period of the pulse signal.

2. The AC voltage detecting circuit according to claim 1, wherein the current-to-voltage converting circuit includes a bridge circuit configured by a pair of series circuits, each of which is configured by two circuit elements, and wherein a contact node between the circuit elements of one of the pair of series circuits of the bridge circuit is connected to the reference potential, and wherein a contact node between the circuit elements of the other of the pair of series circuits is connected to the voltage detecting unit.

3. An AC voltage detecting circuit comprising:

a first capacitor including a first electrode configured to connect to one end of an AC power supply, and a second electrode;

a second capacitor including a first electrode configured to connect to another end of the AC power supply, and a second electrode;

a current-to-voltage converting circuit, which is connected in series between the second electrode of the first capacitor and the second electrode of the second capacitor, and which is connected to a reference potential, wherein the current-to-voltage converting circuit includes a resistor and as AC current passes through the current-to-voltage converting circuit when the AC current returns to the AC power supply, the current-to-voltage converting circuit converts, by the resistor, the AC current output from the AC power supply into a detection AC voltage; and a voltage detecting unit, which detects an AC input voltage of the AC power supply, based on the detection AC voltage;

wherein the voltage detecting unit includes:

a detection signal generating circuit, which generates a voltage detection signal for detecting the AC input voltage; and an arithmetic circuit, which calculates the AC input voltage based on the voltage detection signal, wherein the detection signal generating circuit includes a peak holding circuit that holds the detection AC voltage, wherein the peak holding circuit is connected to the current-to-voltage converting circuit and holds a peak voltage of the AC input voltage, wherein the peak holding circuit includes a capacitor, one end of which is connected to the reference potential, wherein the arithmetic circuit calculates the AC input voltage based on the peak-held detection AC voltage and uses an impedance of a circuit including at least one of the first capacitor and the second capacitor and a value of the resistor, wherein the current-to-voltage converting circuit includes a bridge circuit including a pair of series circuits, each of which includes two circuit elements;

wherein a contact node between the circuit elements of one of the pair of series circuits of the bridge circuit is connected to the reference potential; and wherein a contact node between the circuit elements of another of the pair of series circuits is connected to the voltage detecting unit.

4. The AC voltage detecting circuit according to claim 3, wherein the detection signal generating circuit includes a discharging circuit, which discharges charge of the AC input voltage held at the peak by the peak holding circuit after the voltage detecting unit detects the AC input voltage.

* * * * *